(12) United States Patent
Chiou et al.

(10) Patent No.: US 9,431,991 B2
(45) Date of Patent: Aug. 30, 2016

(54) COMMON MODE FILTER

(71) Applicant: Wistron Corporation, New Taipei (TW)

(72) Inventors: Sheng-Lun Chiou, New Taipei (TW); Yin-Yu Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/569,788

(22) Filed: Dec. 15, 2014

(65) Prior Publication Data

US 2016/0093937 A1   Mar. 31, 2016

(30) Foreign Application Priority Data

Sep. 30, 2014   (TW) .............................. 103133960 A (51) Int. Cl.
| | |
|---|---|
| *H03H 7/01* | (2006.01) |
| *H01P 1/203* | (2006.01) |
| *H03H 7/42* | (2006.01) |
| *H01P 3/08* | (2006.01) |
| *H01P 1/20* | (2006.01) |
| *H05K 1/00* | (2006.01) |

(52) U.S. Cl.
CPC ................ *H03H 7/427* (2013.01); *H01P 1/20* (2013.01); *H01P 1/203* (2013.01); *H01P 1/20345* (2013.01); *H01P 1/20381* (2013.01); *H01P 3/082* (2013.01); *H05K 1/00* (2013.01)

(58) Field of Classification Search
CPC ........ H03H 7/427; H03H 7/12; H01P 1/203; H01P 3/082; H01P 3/08
USPC .................. 333/4, 5, 12, 174, 175, 185, 205
See application file for complete search history.

(56) References Cited

U.S. PATENT DOCUMENTS

| | | | |
|---|---|---|---|
| 2011/0210903 A1* | 9/2011 | Sarabandi | H01Q 15/0086 343/904 |
| 2011/0279197 A1 | 11/2011 | Kameya | |
| 2012/0098627 A1 | 4/2012 | Kameya | |
| 2012/0194291 A1* | 8/2012 | Pajovic | H04B 3/28 333/12 |
| 2014/0062611 A1* | 3/2014 | Wu | H01P 1/203 333/12 |

OTHER PUBLICATIONS

"Office Action of Taiwan Counterpart Application" with partial English translation, issued on Mar. 17, 2016, p. 1-p. 7.

* cited by examiner

*Primary Examiner* — Robert Pascal
*Assistant Examiner* — Rakesh Patel
(74) *Attorney, Agent, or Firm* — Jianq Chyun IP Office (57) ABSTRACT

A common mode filter includes a ground element, a transmission line pair and an extension element, which are disposed in first to third signal layers of a circuit board. The ground element includes a ground portion and a first ground line electrically connected with each other. The first ground line is disposed in a slot of the ground portion, and extends from a bottom portion to an opening of the slot. An orthogonal projection of the transmission line pair on the first signal layer is partially overlapped with an orthogonal projection of the ground portion on the first signal layer. The orthogonal projection of the transmission line pair on the first signal layer is not overlapped with an orthogonal projection of the first ground line on the first signal layer. The extension element is electrically connected to the first ground line through at least one conductive via.

17 Claims, 5 Drawing Sheets

COMMON MODE FILTER

CROSS-REFERENCE TO RELATED APPLICATION

This application claims the priority benefit of Taiwan application serial no. 103133960, filed on Sep. 30, 2014. The entirety of the above-mentioned patent application is hereby incorporated by reference herein and made a part of this specification.

BACKGROUND OF THE INVENTION

1. Field of the Invention

The invention relates to a filter, and particularly relates to a common mode filter.

2. Description of Related Art

Common mode filters are used to suppress electromagnetic interference (EMI) generated by differential signals on a transmission path. Thus, common mode filters are broadly used in various electronic devices. In addition, due to the tendency to miniaturize the electronic devices, the common mode filters formed by using the printed circuit board (PCB) manufacturing technology are now becoming more and more popular on the market.

When it comes to the PCB manufacturing technology, processing factors such as materials of the printed circuit boards, parameter variation among sheet materials, and stacked structures, etc., all influence the characteristics of the common mode filters. Thus, it takes the designer a long time to consider influences of said factors to common mode filters of electronic devices. As a result, the design cost of the common mode filters increases accordingly. Thus, how to reduce the design complexity and cost of the common mode filters is now an issue in designing the common mode filters.

SUMMARY OF THE INVENTION

The invention provides a common mode filter capable of using an adjustment circuit connected to an extension element to adjust a frequency response, so as to reduce the design complexity and cost of the common mode filter.

The common mode filter of the invention includes a circuit board, a ground element, a transmission line pair, and an extension element. The circuit board includes a first signal layer, a second signal layer and a third signal layer. The ground element is disposed in the second signal layer, and includes a ground portion and a first ground line electrically connected to each other. In addition, the ground portion includes a slot. The first ground line is disposed in the slot and extends from a bottom portion of the slot to an opening of the slot. The transmission line pair is disposed in the first signal layer. In addition, an orthogonal projection of the transmission line pair on the first signal layer is partially overlapped with an orthogonal projection of the ground portion on the first signal layer. The orthogonal projection of the transmission line pair on the first signal layer is not overlapped with an orthogonal projection of the first ground line on the first signal layer. The extension element is disposed in the third signal layer, and electrically connected to the first ground line through at least one conductive via.

According to an embodiment of the invention, the extension element includes a first extension line, and the at least one conductive via includes a first conductive via. Also, the first ground line is electrically connected to the first extension line through the first conductive via, and the common mode filter further includes a first adjustment circuit. One end of the first adjustment circuit is electrically connected to the first extension line, and the first adjustment circuit is configured to adjust a frequency response of the common mode filter.

Based on the above, the common mode filter of the invention has the extension element electrically connected to the ground element. Thus, the common mode filter may be electrically connected to at least one adjustment circuit through the extension element, and may adjust the frequency response of the common mode filter by using the at least one adjustment circuit. Thus, the design complexity and cost of the common mode filters may be reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
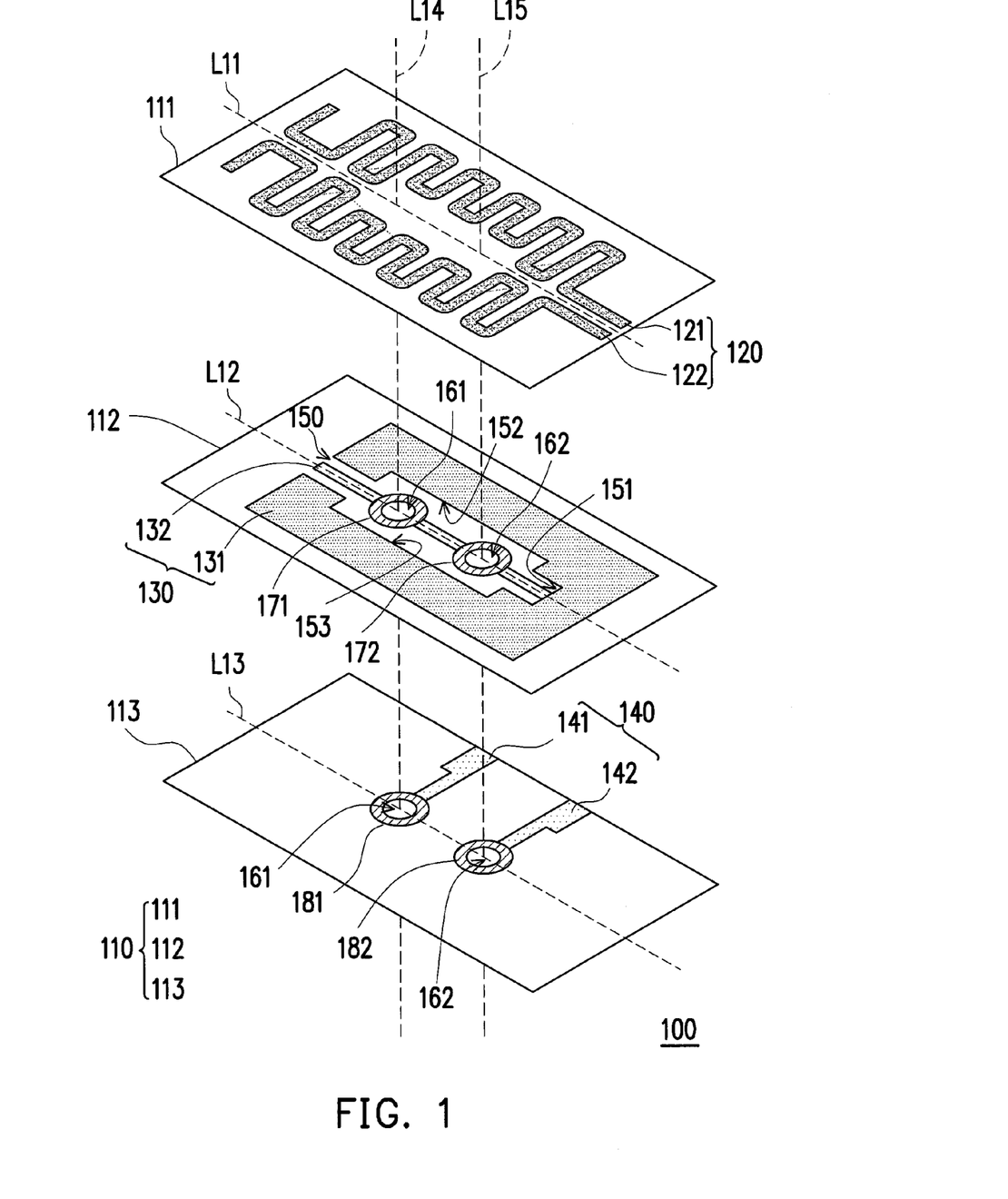
FIG. 1 is a structural schematic view illustrating a common mode filter according to an embodiment of the invention.

FIG. 1 is a structural schematic view illustrating a common mode filter according to an embodiment of the invention, and L11 to L15 are reference lines representing a configuration structure of a common mode filter 100. Referring to FIG. 1, the common mode filter 100 includes a circuit board 110, a transmission line pair 120, a ground element 130, and an extension element 140. In addition, the circuit board 110 includes first to third signal layers 111 to 113. The transmission line pair 120 is disposed in the first signal layer 111, and the transmission line pair 120 includes a first transmission line 121 and a second transmission line 122. In addition, the first transmission line 121 and the second transmission line 122 are symmetrical with respect to the reference line L11 (i.e. the central line of the transmission line pair 120). In addition, each of the first transmission line 121 and the second transmission line 122 has a meandering structure.

The ground element 130 is disposed in the second signal layer 112, and includes a ground portion 131 and a first ground line 132 that are electrically connected to each other. In addition, the ground portion 131 has a slot 150. The first ground line 132 is disposed in the slot 150, and a first end of the first ground line 132 is electrically connected to a bottom portion 151 of the slot 150. Besides, the first ground line 132 extends from the bottom portion 151 of the slot 150 to an opening of the slot 150. Moreover, the first ground line 132 and sidewalls 152 to 153 of the slot 150 are spaced by a predetermined distance. In other words, a gap is between the first ground line 132 and the sidewall 152 of the slot 150, and another gap is between the first ground line 132 and the sidewall 153 of the slot 150.

Furthermore, the ground element 130 is symmetrical with respect to the reference line L12, and a shape of the ground portion 131 may be rectangular, for example. Although the embodiment shown in FIG. 1 illustrates an implementation of the ground element 130, the invention is not limited thereto. For example, in another embodiment, the shape of the ground element 130 may also be trapezoidal, square, triangular, or the shape may be an arbitrary geometrical shape symmetrical with respect to the reference line 12. Meanwhile, the first ground line 132 may also have a plurality of bends in correspondence with the shape of the ground element 130.

The extension element 140 is disposed in the third signal layer 113, and the extension element 140 includes a first extension line 141 and a second extension line 142. In addition, the common mode filter 100 further includes a first conductive via 161 and a second conductive via 162. In addition, as indicated by the reference lines L14 and L15, the first extension line 141 may be electrically connected to the first ground line 132 through the first conductive via 161, and the second extension line 142 may be electrically connected to the first ground line 132 through the second conductive via 162. It should be noted that people having ordinary skill in the art may selectively dispose a pad around the conductive via according to the design requirement, so as to enhance connection strength between the conductive vias and the conductive lines.

For example, in the embodiment shown in FIG. 1, the common mode filter 100 further includes pads 171, 172, 181, and 182. In addition, the pads 171 and 172 are disposed in the second signal layer 112, and the pads 181 and 182 are disposed in the third signal layer 113. Besides, the pads 171 and 181 surround the first conductive via 161, and respectively cover the first ground line 132 and the first extension line 141. In this way, the pads 171 and 181 may respectively enhance connection strengths of the first conductive via 161 with the first ground line 132 and the first extension line 141. Similarly, the pads 172 and 182 surround the second conductive via 162, and respectively cover the first ground line 132 and the second extension line 142. In this way, the pads 172 and 182 may respectively enhance connection strengths of the second conductive via 162 with the first ground line 132 and the second extension line 142.

Figure 2:
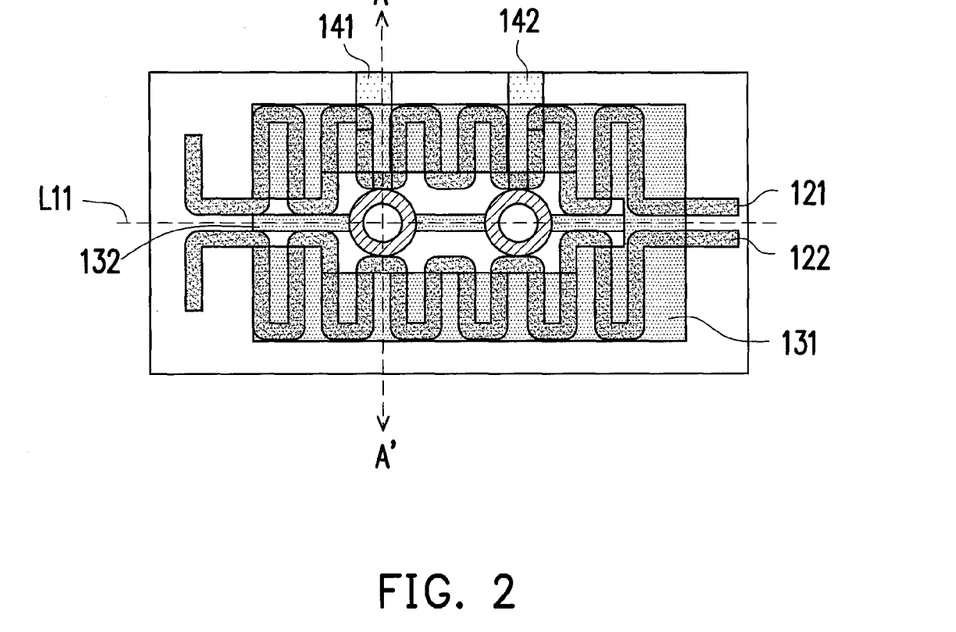
FIG. 2 is a perspective structural schematic view illustrating a common mode filter being orthogonally projected on the same surface according to an embodiment of the invention.

FIG. 2 is a perspective structural schematic view illustrating a common mode filter being orthogonally projected on the same surface according to an embodiment of the invention. As shown in FIG. 2, the transmission line pair 120, the ground element 130, and the extension element may be orthogonally projected on the first signal layer 111, for example. In addition, viewing by taking the reference line L11 (i.e. the central line of the transmission line pair 120) of the first signal layer 111, an orthogonal projection of the transmission line pair 120 on the first signal layer 111 and an orthogonal projection of the ground element 130 on the first signal layer 111 are symmetrical with respect to the reference line L11. Besides, an orthogonal projection of the transmission line pair 120 on the first signal layer 111 is partially overlapped with an orthogonal projection of the ground portion 131 on the first signal layer 111, and the orthogonal projection of the transmission line pair 120 on the first signal layer 111 is not overlapped with an orthogonal projection of the first ground line 132 on the first signal layer 111.

Figure 3:
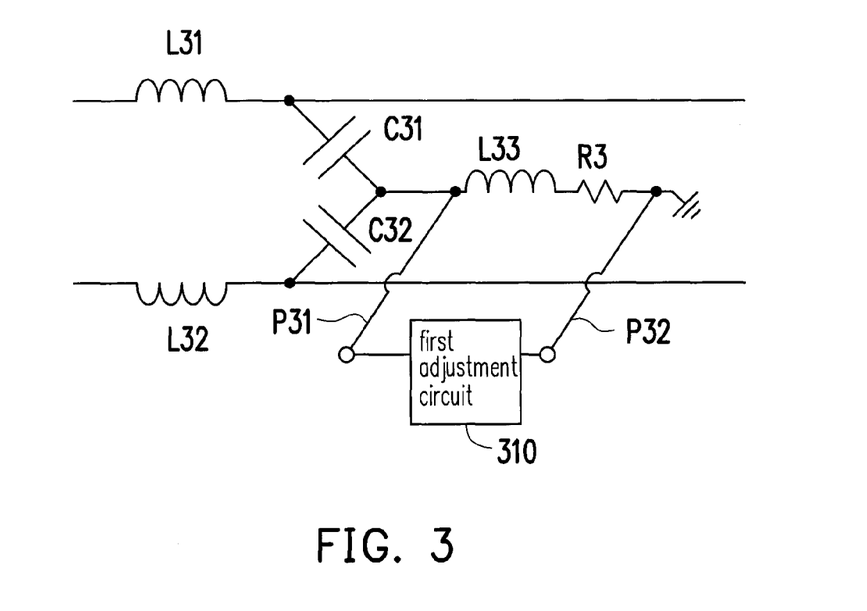
FIG. 3 is an equivalent circuit schematic view illustrating a common mode filter according to an embodiment of the invention.

FIG. 3 is an equivalent circuit schematic view illustrating a common mode filter according to an embodiment of the invention. As shown in FIG. 3, the transmission line pair 120 may be equivalent to an inductor L31 and an inductor L32, and the ground element 130 may be equivalent to an inductor L33 and a resistor R3. In addition, since the transmission line pair 120 is partially overlapped with the ground portion 131, a capacitor C31 and a capacitor C32 may be formed in the equivalent circuit. In addition, with a combination of the inductors L31 to L33, the capacitors C31 to C32, and the resistor R3, the common mode filter 100 may generate a corresponding filter response, and an operation frequency of the common mode filter 100 is related to the inductor L33 and the resistor R3. Thus, in an operation, the common mode filter 100 may transmit a differential signal through the transmission line pair 120, and may suppress electromagnetic interference by filtering out a common mode current in the differential signal.

It should be noted that since the extension element 140 is electrically connected to the first ground line 132 through the first conductive via 161 and the second conductive via 162, the common mode filter 100 may have a first connecting end P31 and a second connecting end P32 extending from two sides of the inductor L33 and the resistor R3 in the equivalent circuit. Accordingly, the common mode filter 100 may adjust the operation frequency by using an element (e.g. a first adjustment circuit 310) electrically connected to the extension element 140.

Figure 4:
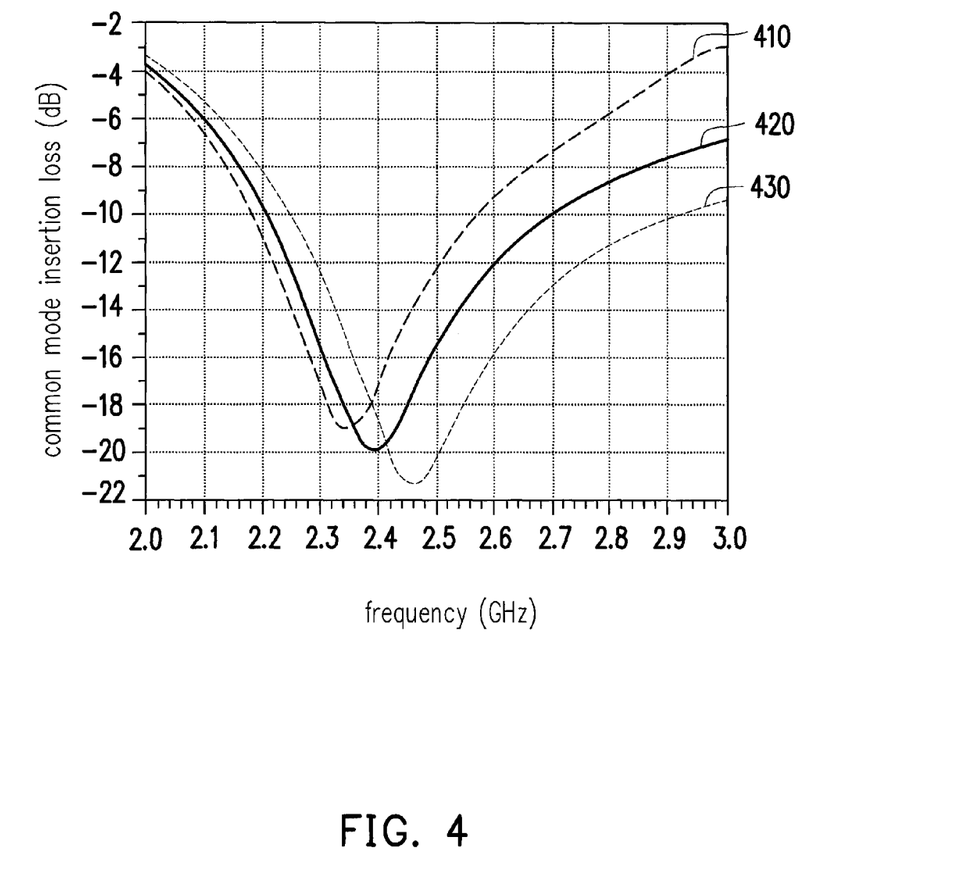
FIG. 4 is a diagram illustrating a common mode insertion loss of a common mode filter according to an embodiment of the invention.

For example, FIG. 4 is a diagram illustrating a common mode insertion loss (Scc21) of a common mode filter according to an embodiment of the invention. As shown in FIG. 4, the common mode filter 100 may have different characteristic curves 410 to 430 in response to different first adjustment circuits 310. In addition, a concave part of each of the characteristic curves 410 to 430 is the operation frequency of the common mode filter 100. In other words, by disposing the extension element 140, the designer is able to adjust the operation frequency of the common mode filter 100 by using the element (e.g. the first adjustment circuit 310) electrically connected to the extension element 140, so as to reduce the design complexity and cost of the common mode filter 100.

In particular, the extension element 140 in the common mode filter 100 is disposed to extend from the ground element 130, and such configuration is different from the conventional concept in the design of a common mode filter. Generally speaking, the design of a conventional common mode filter tries to avoid a wire extending from the ground element 130 as much as possible, so as to avoid inducing an undesired coupling effect. However, in FIG. 1, the extension element 140 extends from a specific position (e.g. the first ground line 132) of the ground element 130, and the operation frequency of the common mode filter 100 is thus adjusted by using the element connected to the extension element 140.

It should be noted that the first adjustment circuit 310 may also be disposed in a signal layer (e.g. the third circuit layer 113) of the circuit board 110, for example. Besides, the circuit board 110 of the common mode filter 100 may be realized by using a multi-layer printed circuit board with four or more layers, and the signal layers 111 to 113 may be realized by using any three signal layers in a multi-layer printed circuit. For example, FIGS. 5-7 are cross-sectional views illustrating a common mode filter along a cross-sectional line A-A' of FIG. 2 according to an embodiment of the invention.

Figure 5:
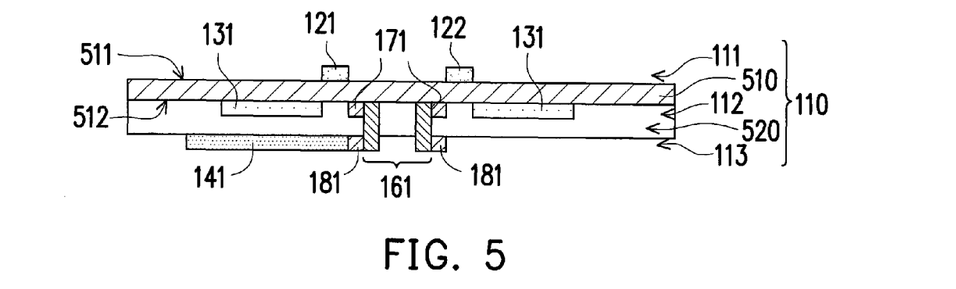
FIGS. 5-7 are cross-sectional views illustrating a common mode filter along a cross-sectional line A-A' of FIG. 2 according to an embodiment of the invention.

In the embodiment shown in FIG. 5, the circuit board 110 of the common mode filter 100 further includes a first insulation layer 510 and a second insulation layer 520. In addition, the first insulation layer 510 is located between the first signal layer 111 and the second signal layer 112, and the second insulation layer 520 is located between the second signal layer 112 and the third signal layer 113. Also, the first conductive via 161 is penetratingly disposed at the second signal layer 112, the second insulation layer 520, and the third signal layer 113, so that the first conductive via 161 is electrically connected to the first ground line 132 through the pad 171 and is electrically connected to the first extension line 141 through the pad 181.

Moreover, the first insulation layer 510 may be an insulating substrate, for example. The insulating substrate includes a first surface 511 and a second surface 512 opposite to each other. Also, the first surface 511 of the insulating substrate faces to the first signal layer 111, and the second surface 512 of the insulating substrate faces to the second signal layer 112. In other words, the transmission line pair 120 is disposed on the first surface 511 of the insulating substrate, and the ground element 130 is disposed on the second surface 512 of the insulating substrate. Moreover, the third signal layer 113 is, for example, a bottom layer of the circuit board 110, and the first conductive via 161 is a blind via, for example. In another embodiment, the first conductive via 161 may also be a through hole via penetrating the whole circuit board 110, for example.

Figure 6:
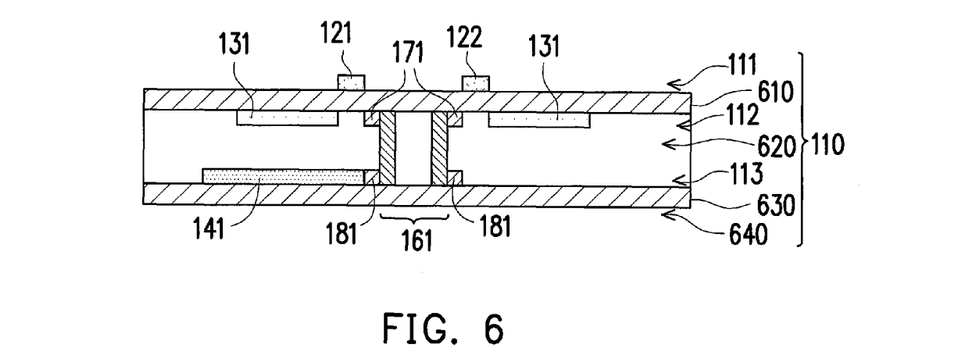
Figure 7:
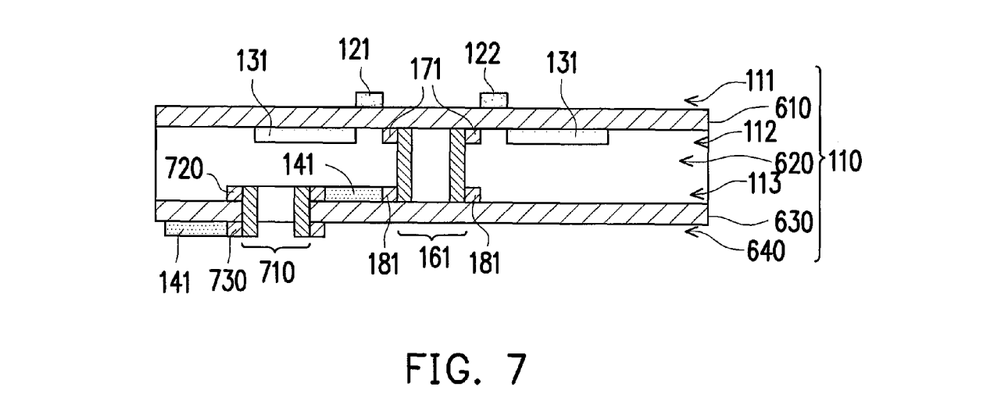

In the embodiment shown in FIG. 6, the circuit board 110 of the common mode filter 100 further includes a first insulation layer 610, a second insulation layer 620, a third insulation layer 630, and a fourth signal layer 640. In addition, the first insulation layer 610 is located between the first signal layer 111 and the second signal layer 112, the second insulation layer 620 is located between the second signal layer 112 and the third signal layer 113, and the fourth signal layer 640 is disposed below the third insulation layer 630. Also, the first conductive via 161 is penetratingly disposed at the second signal layer 112, the second insulation layer 620, and the third signal layer 113, so that the first conductive via 161 is electrically connected to the first ground line 132 through the pad 171 and is electrically connected to the first extension line 141 through the pad 181. Moreover, the first insulation layer 610 and the third insulation layer 630 may be insulating substrates, respectively, and the first conductive via 161 may be a buried via, for example.

In the above embodiments, the extension element 140 is disposed in a single signal layer (e.g. the third signal layer 113) of the circuit board 110. However, in another embodiment, the extension element 140 may also be disposed in a plurality of signal layers of the circuit board 110. For example, in the embodiment shown in FIG. 7, the first extension line 141 disposed in the third signal layer 113 further extends to the fourth signal layer 640 through a third conductive via 710. In addition, pads 720 and 730 surround the third conductive via 710, and are respectively disposed in the third signal layer 113 and the fourth signal layer 640, so as to enhance a connection strength between the third conductive via 710 and the first extension line 141.

It should be noted that the common mode filter 100 shown in FIG. 1 is electrically connected to two ends of the first adjustment circuit 310 respectively through the extension lines of the extension element 140. However, in another embodiment, the common mode filter 100 shown in FIG. 1 may also be electrically connected to an end of the first adjustment circuit 310 through a single extension line of the extension element 140, while the other end of the first adjustment circuit 310 may be electrically connected to a ground end through an external element. In other words, people having ordinary skill in the art may selectively remove one (e.g. the first extension line 141) of the extension lines of the extension element 140, and correspondingly remove the corresponding conductive via (e.g. the first conductive via 161) according to the design requirement.

Figure 8:
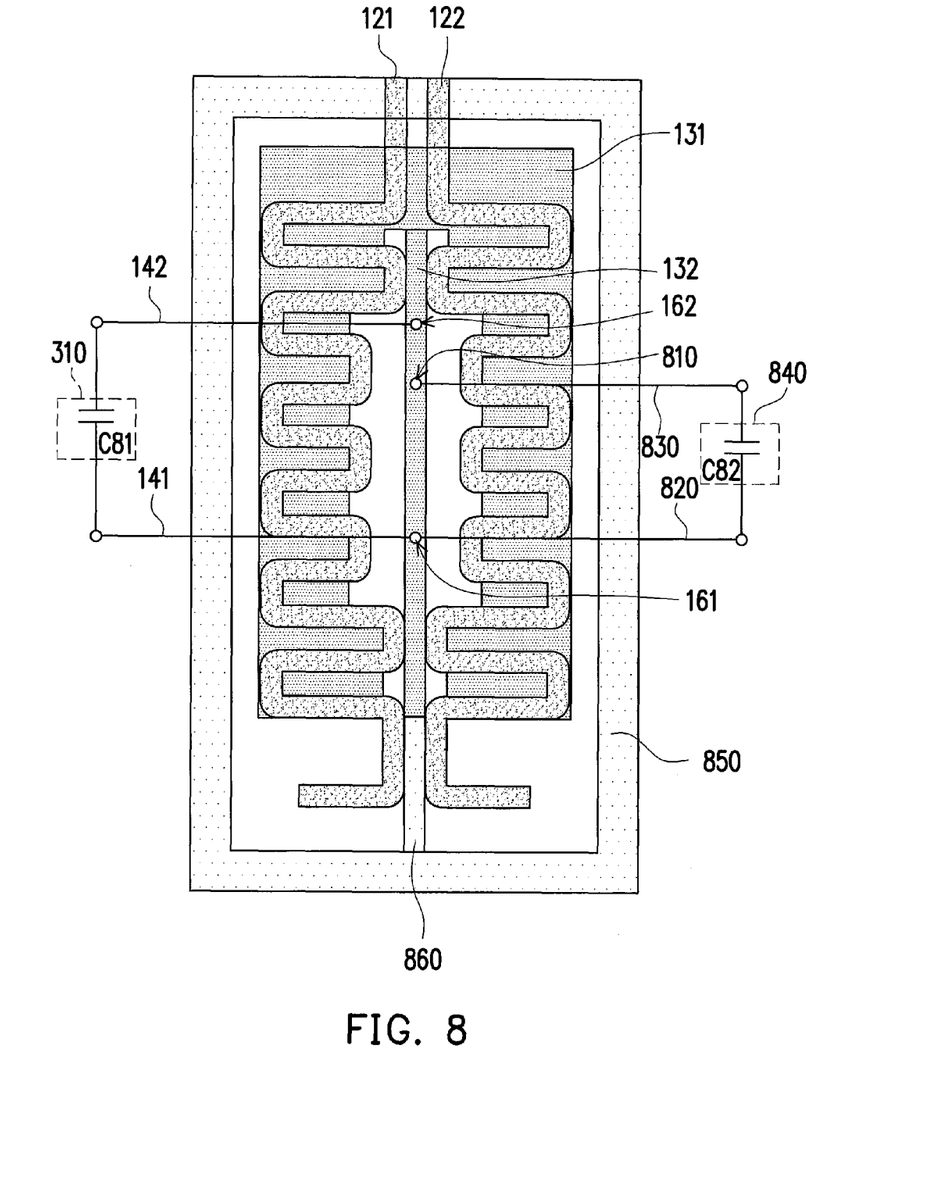
FIG. 8 is a perspective structural schematic view illustrating a common mode filter according to another embodiment of the invention.

In another embodiment, three or more extension lines may be disposed in the common mode filter 100 of FIG. 1, so as to be electrically connected to two or more adjustment circuits through the extension element 140. For example, FIG. 8 is a perspective structural schematic view illustrating a common mode filter according to another embodiment of the invention. In the embodiment shown in FIG. 8, the common mode filter 100 further includes a third conductive via 810, and the extension element 140 further includes a third extension line 820 and a fourth extension line 830. In addition, the first ground line 132 may be electrically connected to the third extension line 820 and the fourth extension line 830 through the first conductive via 161 and the third conductive via 810. Accordingly, the common mode filter 100 may be electrically connected to two ends of a second adjustment circuit 810 by using the third extension line 820 and the fourth extension line 840, so as to adjust the operation frequency by further using the second adjustment circuit 840.

Although the embodiment of FIG. 8 is described with an ordering sequence of the conductive vias 161, 162, and 810, the ordering sequence does not serve to limit the invention. For example, in FIG. 8, the third conductive via 810 is located between the first conductive via 161 and the second conductive via 162. However, in another embodiment, the first conductive via 161 may be disposed between the second conductive via 162 and the third conductive via 810, for example. In addition, in FIG. 8, the first ground line 132 is electrically connected to the first extension line 141 and the third extension line 820 through the same conductive via (i.e. the first conductive via 161). However, in another embodiment, the first ground line 132 may also be electrically connected to the first extension line 141 and the third extension line 820 through two conductive vias respectively.

In other words, people having ordinary skill in the art may dispose the conductive vias in different combinations and ordering sequences according to the design requirement, so that the common mode filter 100 may be electrically connected to at least one adjustment circuit through the extension element 140. In addition, people having ordinary skill in the art may further use the conductive vias in different combinations and ordering sequences to adjust the frequency response, a common-to-common mode S-parameter Scc, a common-to-differential mode S-parameter Scd, and a differential-to-common mode S-parameter Sdc of the common mode filter 100.

Referring to FIG. 8 again, the common mode filter 100 further includes a ground plane 850, and the ground element 130 further includes a second ground line 860. In addition, a first end of the second ground line 860 is electrically connected to the first ground line 132, and a second end of the second ground line 860 is electrically connected to the ground plane 850. In addition, the first adjustment circuit 310 and the second adjustment circuit 840 may be respectively formed by a capacitor C81 and a capacitor C82. A first end of the capacitor C81 is electrically connected to the first extension line 141, and a second end of the capacitor C81 is electrically connected to the second extension line 142. Also, a first end of the capacitor C82 is electrically connected to the third extension line 820, and a second end of the capacitor C82 is electrically connected to the fourth extension line 830. Besides, in another embodiment, the first adjustment circuit 310 and the second adjustment circuit 840 may also be respectively formed by a capacitor, an inductor, a resistor, or any combination thereof.

In view of the foregoing, the common mode filter of the invention has the extension element electrically connected to the ground element. Thus, the common mode filter may be electrically connected to at least one adjustment circuit through the extension element, and may adjust the frequency response of the common mode filter by using the at least one adjustment circuit. In other words, by disposing the extension element, the designer is able to adjust the frequency response of the common mode filter by using the adjustment circuit electrically connected to the extension element, so as to reduce the design complexity and cost of the common mode filter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A common mode filter, comprising:
   a circuit board, comprising a first signal layer, a second signal layer and a third signal layer;
   a ground element, disposed in the second signal layer, and comprising a ground portion and a first ground line electrically connected to each other, wherein the ground portion includes a slot, and the first ground line is disposed in the slot and extends from a bottom portion of the slot to an opening of the slot;
   a transmission line pair, disposed in the first signal layer, wherein an orthogonal projection of the transmission line pair on the first signal layer is partially overlapped with an orthogonal projection of the ground portion on the first signal layer, and the orthogonal projection of the transmission line pair on the first signal layer is not overlapped with an orthogonal projection of the first ground line on the first signal layer; and
   an extension element, disposed in the third signal layer, wherein the extension element is electrically connected to the first ground line through at least one conductive via,
   wherein an orthogonal projection of the ground element on the first signal layer is symmetrical with respect to a central line of the transmission line pair.

2. The common mode filter as claimed in claim 1, wherein the transmission line pair comprises a first transmission line and a second transmission line, the first transmission line and the second transmission line are symmetrical with respect to the central line of the transmission line pair, and each of the first and second transmission lines has a meandering structure.

3. The common mode filter as claimed in claim 1, wherein the extension element comprises a first extension line, the at least one conductive via comprises a first conductive via, the first ground line is electrically connected to the first extension line through the first conductive via, and the common mode filter further comprises:
   a first adjustment circuit, wherein one end of the first adjustment circuit is electrically connected to the first extension line, and the first adjustment circuit is configured to adjust a frequency response of the common mode filter.

4. The common mode filter as claimed in claim 3, wherein the extension element further comprises a second extension line, the at least one conductive via further comprises a second conductive via, the first ground line is electrically connected to the second extension line through the second conductive via, and another end of the first adjustment circuit is electrically connected to the second extension line.

5. The common mode filter as claimed in claim 4, wherein the extension element further comprises a third extension line and a fourth extension line, the at least one conductive via further comprises a third conductive via, the first ground line is electrically connected to the third extension line and the fourth extension line through the first conductive via and the third conductive via, and the common mode filter further comprises:
   a second adjustment circuit, wherein two ends of the second adjustment circuit are respectively electrically connected to the third extension line and the fourth extension line, and the second adjustment circuit is configured to adjust the frequency response of the common mode filter.

6. The common mode filter as claimed in claim 4, wherein the first adjustment circuit comprises a capacitor, a first end of the capacitor is electrically connected to the first extension line, and a second end of the capacitor is electrically connected to the second extension line.

7. The common mode filter as claimed in claim 1, wherein the circuit board further comprises a first insulation layer and a second insulation layer, the first insulation layer is disposed between the first signal layer and the second signal layer, the second insulation layer is disposed between the second signal layer and the third signal layer and the at least one conductive via is penetratingly disposed at the second signal layer, the second insulation layer, and the third signal layer and is electrically connected to the ground element and the extension element.

8. The common mode filter as claimed in claim 7, wherein the first insulation layer is an insulating substrate, and the insulating substrate comprises a first surface and a second surface opposite to each other, wherein the transmission line pair is disposed on the first surface, and the ground element is disposed on the second surface.

9. The common mode filter as claimed in claim 7, wherein the extension element comprises a first extension line, the at least one conductive via comprises a first conductive via, the first ground line is electrically connected to the first extension line through the first conductive via, and the common mode filter further comprises:

a first adjustment circuit, wherein one end of the first adjustment circuit is electrically connected to the first extension line, and the first adjustment circuit is configured to adjust a frequency response of the common mode filter.

10. The common mode filter as claimed in claim 9, wherein the extension element further comprises a second extension line, the at least one conductive via further comprises a second conductive via, the first ground line is electrically connected to the second extension line through the second conductive via, and another end of the first adjustment circuit is electrically connected to the second extension line.

11. The common mode filter as claimed in claim 10, wherein the extension element further comprises a third extension line and a fourth extension line, the at least one conductive via further comprises a third conductive via, the first ground line is electrically connected to the third extension line and the fourth extension line through the first conductive via and the third conductive via, and the common mode filter further comprises:
a second adjustment circuit, wherein two ends of the second adjustment circuit are respectively electrically connected to the third extension line and the fourth extension line, and the second adjustment circuit is configured to adjust the frequency response of the common mode filter.

12. The common mode filter as claimed in claim 10, wherein the first adjustment circuit comprises a capacitor, a first end of the capacitor is electrically connected to the first extension line, and a second end of the capacitor is electrically connected to the second extension line.

13. The common mode filter as claimed in claim 1, wherein the ground element further comprises a second ground line, the common mode filter further comprises a ground plane, wherein a first end of the second ground line is electrically connected to the first ground line, and a second end of the second ground line is electrically connected to the ground plane.

14. The common mode filter as claimed in claim 13, wherein the extension element comprises a first extension line, the at least one conductive via comprises a first conductive via, the first ground line is electrically connected to the first extension line through the first conductive via, and the common mode filter further comprises:
a first adjustment circuit, wherein one end of the first adjustment circuit is electrically connected to the first extension line, and the first adjustment circuit is configured to adjust a frequency response of the common mode filter.

15. The common mode filter as claimed in claim 14, wherein the extension element further comprises a second extension line, the at least one conductive via further comprises a second conductive via, the first ground line is electrically connected to the second extension line through the second conductive via, and another end of the first adjustment circuit is electrically connected to the second extension line.

16. The common mode filter as claimed in claim 15, wherein the extension element further comprises a third extension line and a fourth extension line, the at least one conductive via further comprises a third conductive via, the first ground line is electrically connected to the third extension line and the fourth extension line through the first conductive via and the third conductive via, and the common mode filter further comprises:
a second adjustment circuit, wherein two ends of the second adjustment circuit are respectively electrically connected to the third extension line and the fourth extension line, and the second adjustment circuit is configured to adjust the frequency response of the common mode filter.

17. The common mode filter as claimed in claim 15, wherein the first adjustment circuit comprises a capacitor, a first end of the capacitor is electrically connected to the first extension line, and a second end of the capacitor is electrically connected to the second extension line.

\* \* \* \* \*